(12) United States Patent
Baumgartner et al.

(10) Patent No.: US 8,201,115 B2
(45) Date of Patent: Jun. 12, 2012

(54) SCALABLE REDUCTION IN REGISTERS WITH SAT-BASED RESUBSTITUTION

(75) Inventors: Jason R. Baumgartner, Austin, TX (US); Michael L. Case, Pflugerville, TX (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 12/191,635

(22) Filed: Aug. 14, 2008

(65) Prior Publication Data

US 2010/0042965 A1      Feb. 18, 2010

(51) Int. Cl.
*G06F 17/50* (2006.01)
*G06F 9/455* (2006.01)

(52) U.S. Cl. ........ 716/106; 716/103; 716/107; 716/110; 716/111; 716/112; 716/136; 703/13; 703/14

(58) Field of Classification Search .......... 716/106–107, 716/110–112, 136, 103–104; 703/13–14
See application file for complete search history.

(56) References Cited

U.S. PATENT DOCUMENTS 6,643,827 B1 * 11/2003 Yang .............................. 716/103
7,290,230 B2 * 10/2007 Prasad .......................... 716/106

* cited by examiner

*Primary Examiner* — Nghia Doan
(74) *Attorney, Agent, or Firm* — Yudell Isidore Ng Russell PLLC

(57) ABSTRACT

A method, system, and computer program product for reducing the size of a logic network design, prior to verification of the logic network design. The method includes eliminating registers to reduce the size of the logic network design; thereby, increasing the speed and functionality of the verification process, and decreasing the size of the logic network design. The system identifies one or more compatible resubstitutions of a selected register, wherein the compatible resubstitution expresses the selected register as one or more pre-existing registers of fixed initial state. The resubstitutions are refined utilizing design invariants. When one more resubstitutions are preformed, the system eliminates the selected registers to reduce the size of the logic network design. As a result of the resubstitution process, a logic network design of reduced size is generated.

15 Claims, 5 Drawing Sheets

SCALABLE REDUCTION IN REGISTERS WITH SAT-BASED RESUBSTITUTION

BACKGROUND

1. Technical Field

The present invention relates in general to logic network designs and in particular to the scalable reduction of logic network designs.

2. Description of the Related Art

Within the field of logic synthesis there is a major endeavor to minimize the cost necessary to implement logic networks. Many algorithms exist that are able to minimize the number of gates in the network. One example of theses algorithms is resubstitution. Resubstitution is an algorithm that is utilized to re-express functions in a logic design network in terms of other pre-existing functions. For example, within the Boolean functions F, G, and H, F may be expressed as F=func(G,H) for some function (func). The total cost to implement the network may be reduced as the gates implementing G and H can be repurposed to additionally implement F.

Traditionally resubstitution is performed using Binary Decision Diagrams (BDDs). However, BDDs do not scale well to industrial-sized logic networks, and therefore BDDs can only be used on very small logic networks. Resubstitution may also be performed utilizing a Boolean Satisfiability (SAT) solver. Incorporating a Boolean SAT solver scales much better than the use of BDDs, thereby suggesting that resubstitution may be able to scale to industrial-sized logic networks.

Formal verification is utilized to prove and/or disprove the properties of a logic network design. In the field of formal verification, or formal model checking, there exist several algorithms to prove temporal properties. Many of the algorithms utilized to prove temporal properties are not cost effective, and the computational complexity of the algorithms is proportional to the size of the logic network design, on which the algorithm operates.

SUMMARY OF ILLUSTRATIVE EMBODIMENTS

Disclosed are a method, system, and computer program product for reducing the size of a logic network design, prior to verification of the logic network design. The method includes eliminating registers to reduce the size of the logic network design; thereby, increasing the speed and functionality of the verification process, and decreasing the size of the logic network design. The system identifies one or more compatible resubstitutions of a selected register, wherein the compatible resubstitution expresses the selected register as one or more pre-existing registers of fixed initial state. The resubstitutions are refined utilizing design invariants. When one more resubstitutions are preformed, the system eliminates the selected registers to reduce the size of the logic network design. As a result of the resubstitution process, a logic network design of reduced size is generated.

The above as well as additional objectives, features, and advantages of the present invention will become apparent in the following detailed written description.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
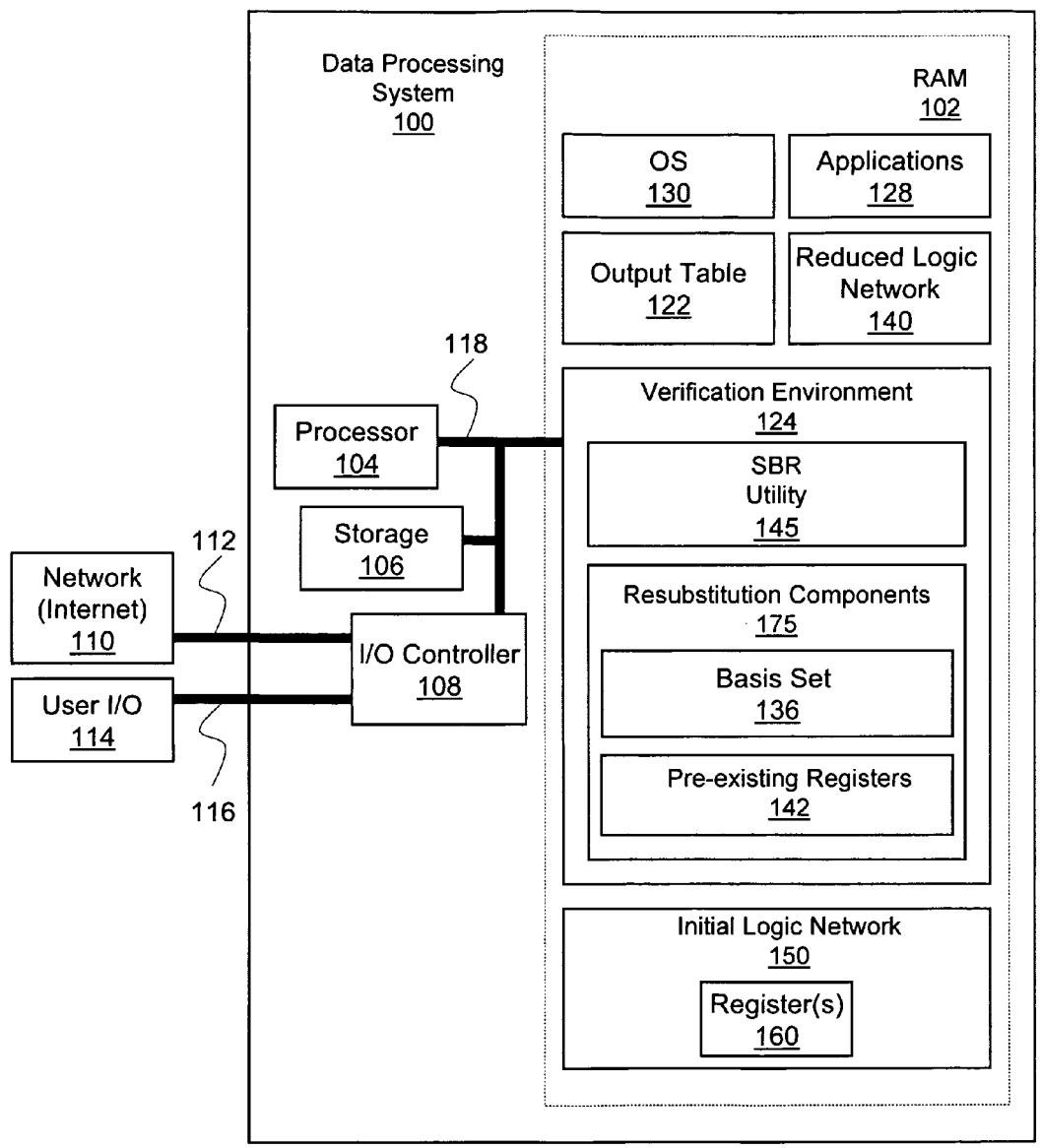
FIG. 1 provides a block diagram representation of an example data processing system within which the invention is practiced, according to one embodiment of the invention.

Disclosed are a method, system, and computer program product for reducing the size of a logic network design, prior to verification of the logic network design. The method includes eliminating registers to reduce the size of the logic network design; thereby, increasing the speed and functionality of the verification process, and decreasing the size of the logic network design. The system identifies one or more compatible resubstitutions of a selected register, wherein the compatible resubstitution expresses the selected register as one or more pre-existing registers of fixed initial state. The resubstitutions are refined utilizing design invariants. When one more resubstitutions are preformed, the system eliminates the selected registers to reduce the size of the logic network design. As a result of the resubstitution process, a logic network design of reduced size is generated.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

With reference now to the figures, and in particular with reference to FIG. 1, a block diagram of a data processing system, in accordance with an embodiment of the present invention, is depicted. Data processing system 100 contains a processing storage unit (e.g., RAM 102) and processor 104. Data processing system 100 also includes non-volatile storage 106 such as a hard disk drive or other direct-access storage device. An Input/Output (I/O) controller 108 provides connectivity to network 110 through a wired or wireless link, such as network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Data processing system 100 stores several items of data and instructions within RAM 102, while operating in accordance with an embodiment of the present invention. These data instructions include initial logic network 150 and output table 122 for interaction with verification environment 124. Other data structures in RAM 102 include reduced logic network 140. Initial logic network 150 contains register(s) 160. Applications 128 and verification environment 124 interface with processor 104, RAM 102, I/O controller 108, and storage 106 through operating system 130. Verification environment 124 includes satisfiability based resubstitution (SBR) utility 145, and resubstitution components 175. Within resubstitution components 175 are basis set 136, and pre-existing register 142. Additional components of data processing system 100 may be added to or substituted for those shown without departing from the scope of the present invention.

For simplicity of the description, the collective body of code that enables various features of the system, including reducing the size of a logic network prior to verification of the logic network, is referred to herein as SBR utility 145. Among the software code/instructions/logic provided by SBR utility 145, and which are specific to the invention, are: (a) code for enabling a Boolean function resubstitution, wherein the Boolean function resubstitution expresses a register as one or more pre-existing registers; (b) code for dynamically selecting a relevant register of a Boolean function basis set; (c) code for identifying one or more resubstitutions of the relevant register, wherein the resubstitutions are compatible resubstitutions that expresses the selected relevant register as one or more pre-existing registers of fixed initial state; (d) code for eliminating one or more registers within the logic network design when the resubstitution is received; and (e) code for generating a reduced sized logic network utilizing the one or more resubstitutions. According to the illustrative embodiment, when processor 104 executes SBR utility 145, data processing system 100 initiates a series of functional processes that enable the above functional features as well as additional features, described herein.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

In one embodiment, initial logic network 150 provides an original logic network, comprising Boolean functions and registers, prior to verification. Within this initial logic network 150 are registers 160. SBR utility 145 receives one or more logic networks, and register 160 is identified. SBR utility 145 receives a Boolean function resubstitution, to replace register 160. The Boolean function resubstitution is computed and integrated into the logic network to replace register 160. When the Boolean function resubstitution is integrated, register 160 is eliminated from initial logic network 150, thereby reducing initial logic network 150.

In one embodiment, the speed of resubstitution is significantly increased utilizing a dynamic basis set. Boolean function basis set 136 comprises one or more pre-existing registers 142 of the Boolean function resubstitution. For example, when expressing a register F as a function in terms of registers G and H, registers G an H are referred to as the basis set. SBR utility 145 dynamically determines one or more relevant registers of Boolean function basis set 136. Relevant registers are registers that logically contribute to a function of the Boolean function resubstitution without creating an illegal logic network that contains combinational cycles. The existence of one or more relevant registers is dynamically confirmed.

In yet another embodiment, invariants are utilized to strengthen the formulation of a Boolean resubstitution. Invariants are properties that hold in every reachable state of the design. For example, in the resubstitution $F=func(G, H)$, the resubstitution would typically be discarded if the function were not true for every valuation of the registers. Instead, the resubstitution function condition is modified to only require equality whenever the invariants hold. One or more invariants are received, wherein the invariants characterize a set of unreachable states of the logic network. One or more invariants are assigned to one or more Boolean functions within the logic network. When performing Boolean SAT-Based Resubstitution, the Boolean SAT solver is constrained to only explore state assignments that satisfy all invariants. An "unsatisfiable" answer from the solver indicates that a resubstitution exists. Constraining the solver, and limiting the solver's ability to find satisfying assignments, increases the number of resubstitutions that are detected in one or more subsequent cycles.

Invariants of the system may be developed from an algorithm that automatically determines properties of the logic network. In one embodiment, the properties include one or more of: determining when a signal is constant in all reachable states, determining that two signals are equivalent in all reachable states, determining that a set of four signals have a fixed logical relationship in all reachable states; and determining that a Boolean implication exists between two signals in all reachable states. The system determines whether a Boolean function is compatible when one or more properties of the Boolean function are detected. When a Boolean function is found to not be compatible, the modified Boolean function is replaced with the original Boolean function.

FIGS. 2-5 are flow charts illustrating various methods by which the above processes of the illustrative embodiments are completed. Although the methods illustrated in FIGS. 2-5 may be described with reference to components shown in FIG. 1, it should be understood that this is merely for convenience and alternative components and/or configurations thereof can be employed when implementing the various methods. Key portions of the methods may be completed by SBR utility 145 executing on processor 104 within data processing system 100 (FIG. 1) and controlling specific operations on data processing system 100, and the methods are thus described from the perspective of both SBR utility 145 and DPS 100.

Figure 2:
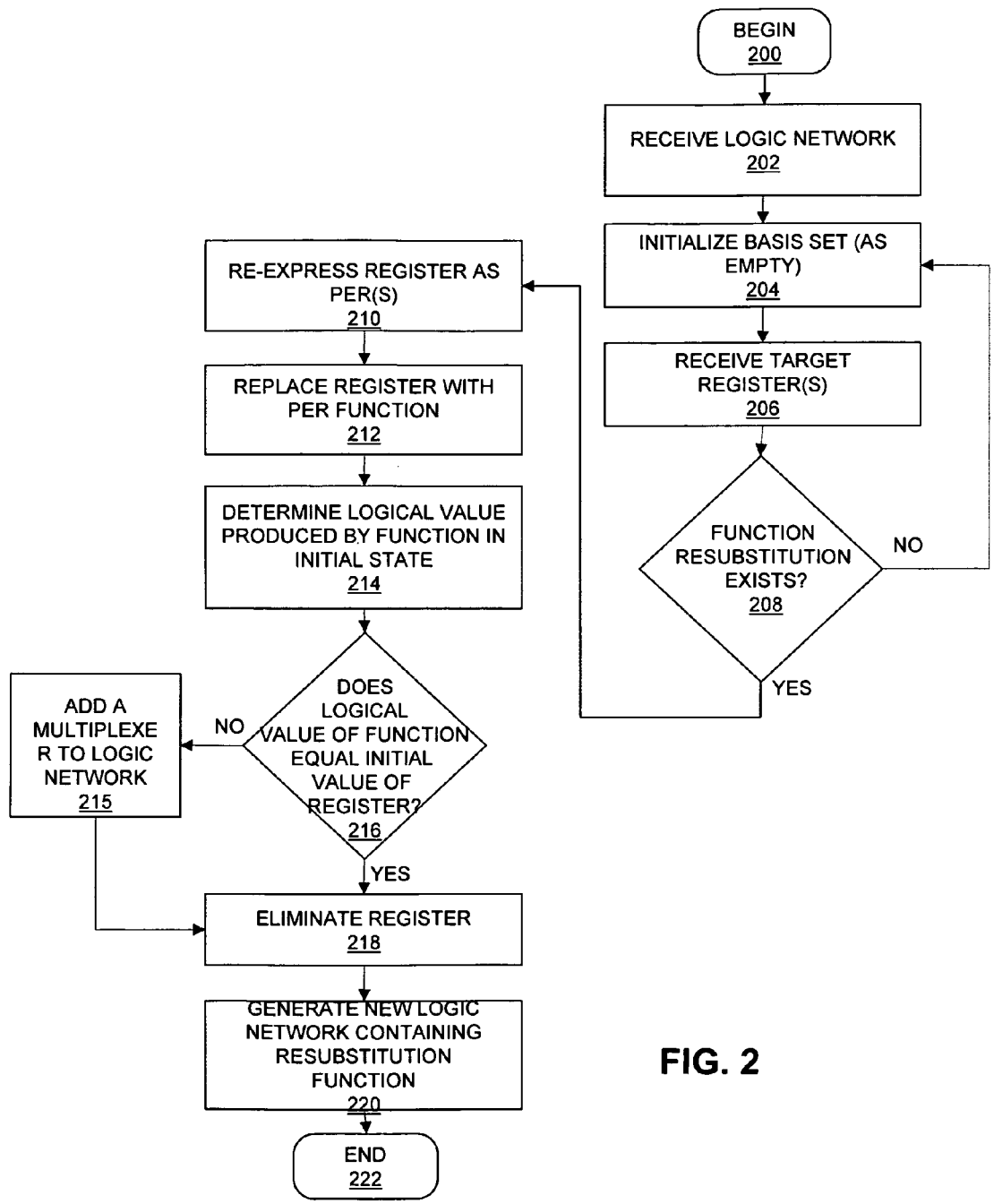
FIG. 2 is a flow chart illustrating the method by which registers of a logic network design are eliminated, in accordance with one embodiment of the invention.

FIG. 2 illustrates a method for eliminating registers to reduce the size of a logic network. Verification is especially sensitive to the number of registers from a logic network and/or logic network design. Resubstitution is utilized to directly eliminate registers; thereby, increasing the speed and functionality of the verification process, and decreasing the size of the logic network. The process of FIG. 2 begins at initiator block 200 and proceeds to block 202, at which a logic network is received. At block 204, one or more basis sets are initialized as empty. Target registers, or registers to be replaced utilizing resubstitution, are received at block 206. At block 208 a decision is made as to whether a function resubstitution exists. If a function resubstitution does not exists, the process returns to block 204 where the basis set is initialized as empty (in preparation to receive another register). If a function resubstitution exists, the process continues to block 210. At block 210 the register is re-expressed as a function of one or more pre-existing registers. The register is replaced by the newly expressed function, or resubstitution function, at block 212.

At block 214, the logical value produced by the resubstitution function in the initial state is determined. At block 216 a decision is made whether the logical value produced by the newly expressed function under the initial state equals the initial value of the original register. If the logical value of the resubstitution function does not equal the initial value of the original register, a multiplexer is introduced that will correct the value of the resubstitution function at time 0, at block 215. The process continues to block 218, where the original register is eliminated from the logical network. If the logical value of the resubstitution function equals the initial value of original register, the original register is eliminated at block 218. A new logic network is generated, at block 220, containing the resubstitution function. The process ends at block 222.

Figure 3:
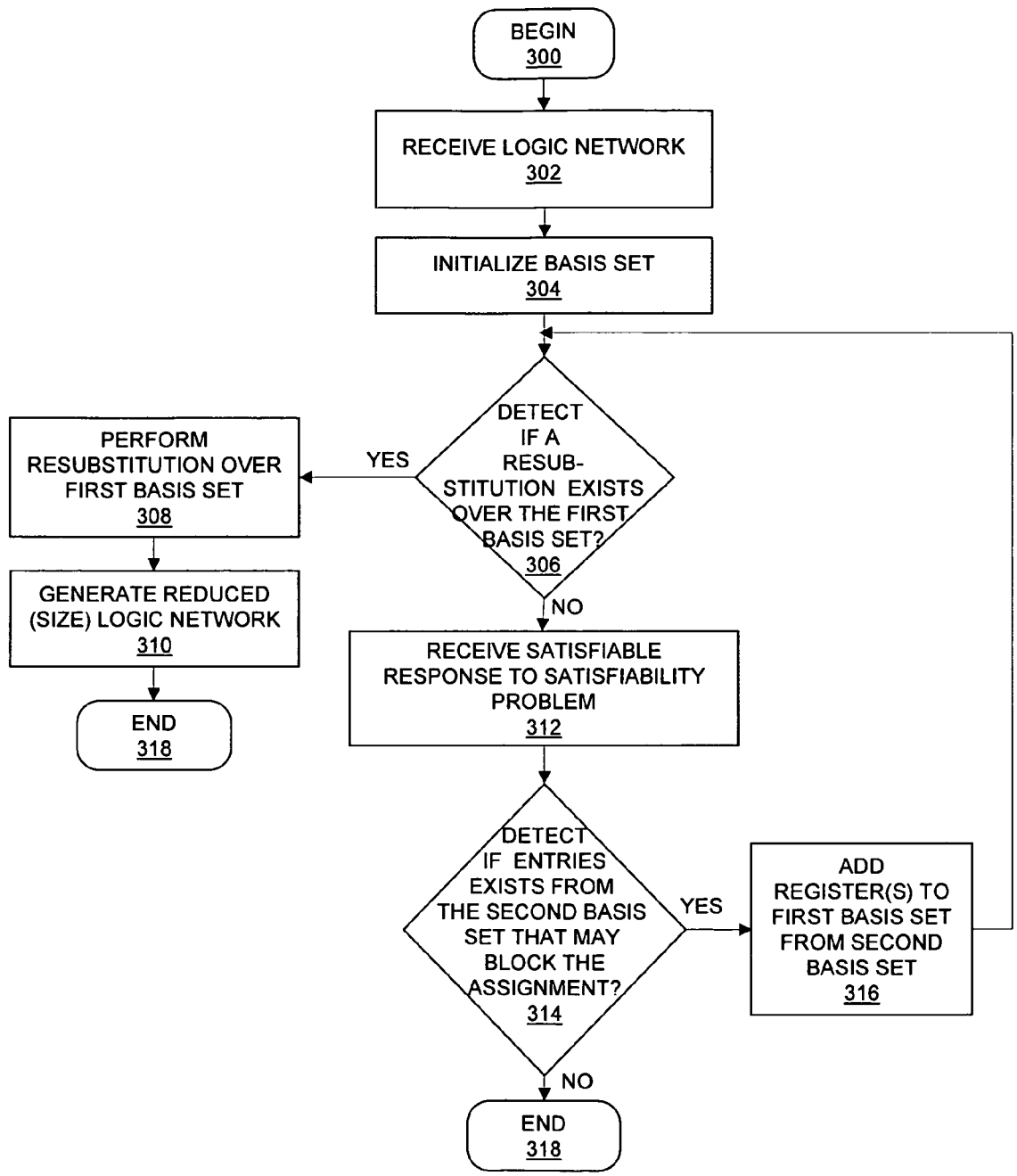
FIG. 3 is a flow chart illustrating the method by which invariant enhanced SAT-based resubstitution is performed, according to one embodiment of the invention.

A process for performing resubstitution over the reduced basis set is depicted in FIG. 3. The process of FIG. 3 begins at initiator block 300 and proceeds to block 302, at which a logic network is received. At block 304, one or more basis sets are initialized as empty. At block 306 a decision is made whether a resubstitution is detected over the first basis set, as indicated by a satisfying assignment. If a resubstitution is detected, the resubstitution is performed over the first basis set at block 308. The reduced size logic network is generated at block 310. The process ends at block 318. If a resubstitution is not detected, a satisfiable response to the satisfiability problem is received at block 312, wherein a satisfiable response is a result received by the Boolean Satisfiability solver when a resubstitution does not exists. At block 314 a decision is made whether entries are detected from the first basis set that may block the assignment. If entries exists that may block the assignment the process continues to block 316. At block 316 one or more registers are added to the first basis set from the second basis set. The process returns to block 306. If an entry, that may block the assignment, does not exist the process ends at block 318.

Figure 4:
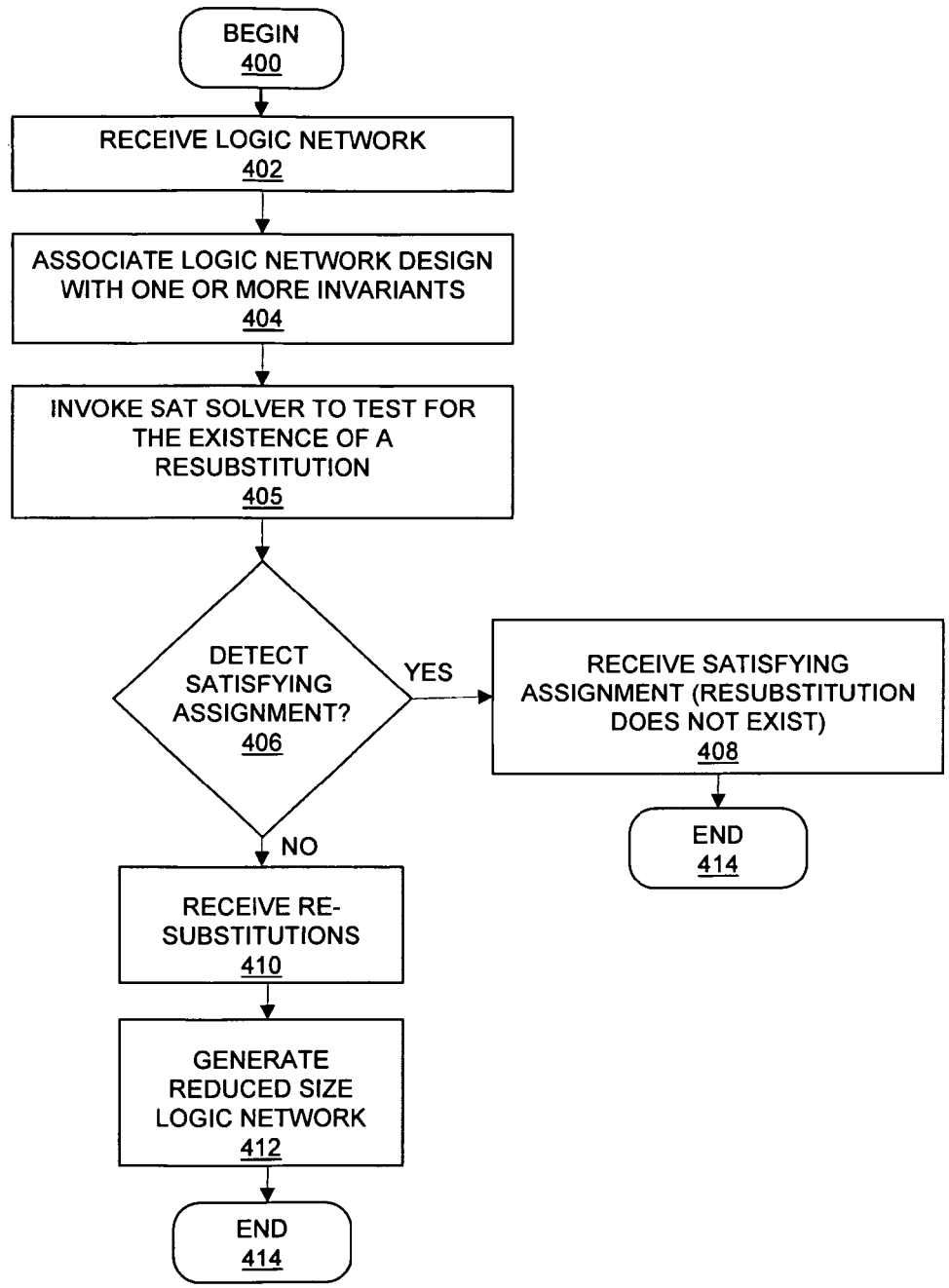
FIG. 4 is a flow chart illustrating the method by which one or more invariants are utilized to eliminate registers, in accordance with one embodiment of the invention.

FIG. 4 depicts a method for utilizing one or more invariants to eliminate registers. The process of FIG. 4 begins at initiator block 400 and proceeds to block 402, at which a logic network is received. At block 404 the logic network is associated with one or more invariants. At block 405 a SAT solver is invoked to test for the existence of a resubstitution. The Boolean satisfiability problem is constrained to only explore solutions that are consistent with the invariants, thereby limiting the space of legal assignments. A decision is made, at block 406, whether a satisfying assignment is detected. If the satisfying assignment is detected, the process continues to block 408, where a satisfying assignment is received, and resubstitution does not exist. The process ends at block 414. If a satisfying assignment is not detected (or unsatisfiable assignment detected), the process continues to block 410 where one or more substitutions are received and the replace register is eliminated. A reduced size logic network is generated at block 412. The process ends at block 414.

Figure 5:
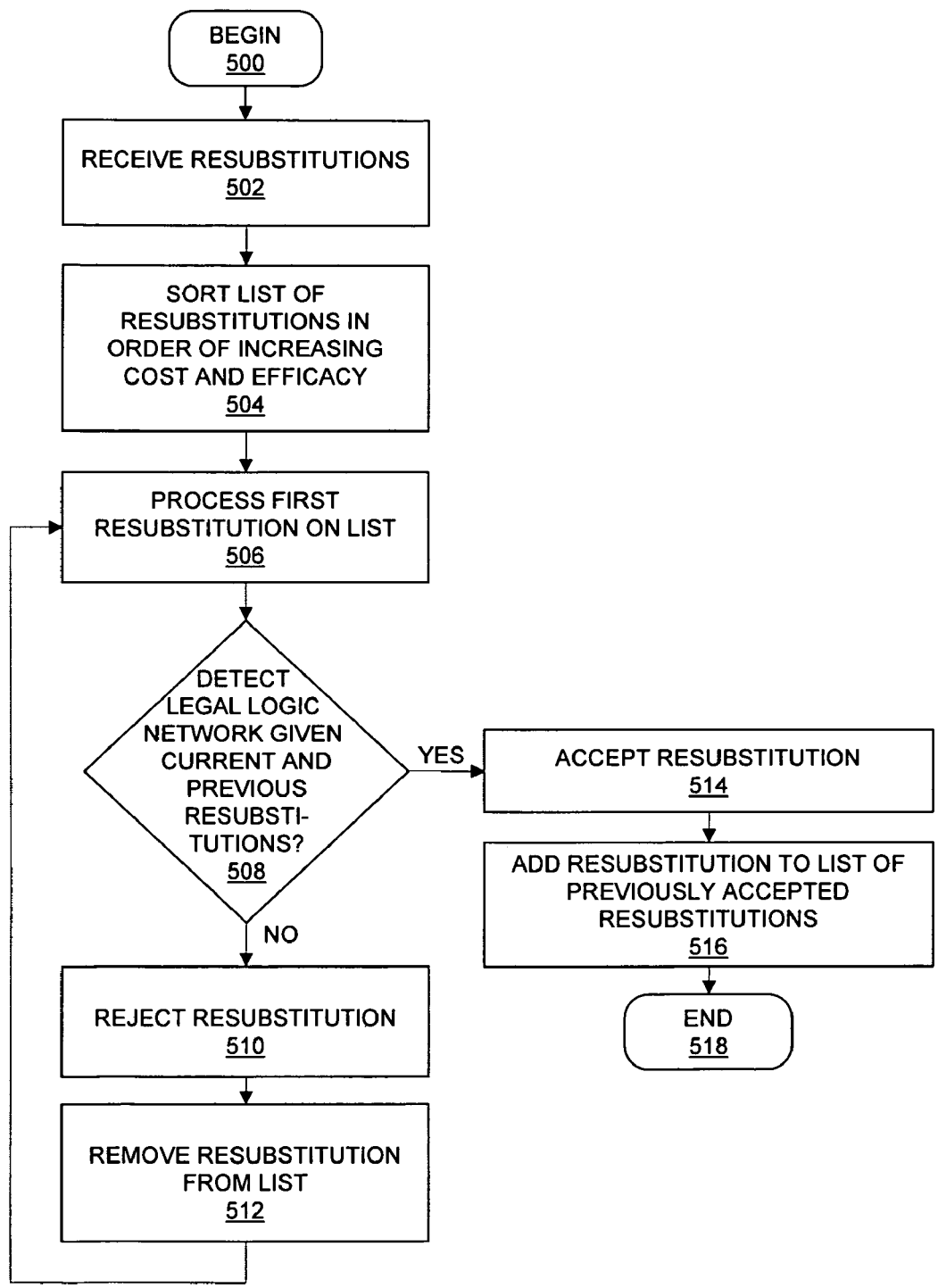
FIG. 5 is a flow chart illustrating the method by which compatible resubstitutions are analyzed, according to one embodiment of the invention.

A method for by FIG. 5. Resubstitution is characterized by the cost to implement substitution of an original register verses the cost to implement the resubstitution function. In the system, the cost is evaluated as the number of logic network elements required to compute the original register verses the number of logic elements needed to produce the resubstitution function. The process of FIG. 5 begins at initiator block 500 and proceeds to block 502. One or more substitutions are received at block 502. At block 504 the list of resubstitutions are sorted in order of increasing cost, with the resubstitutions that are most efficient, or the most able to reduce the size of the logic network, appearing first in the list. The newest element, or first element, on the list is processed at block 506. A decision is made, at block 508, whether a legal logic network, free of combinational cycles, is detected from the results of the current resubstitution, in conjunction with previously accepted resubstitutions. If a legal logic network is not detected, due to the resubstitution, the resubstitution is not a compatible resubstitution, thereby is rejected at block 510. At block 512 the resubstitution is removed from the resubstitution list, and the process returns to block 506. If a legal logic network is detected following the resubstitution, the resubstitution is a compatible resubstitution; thereby the resubstitution is accepted at block 514. At block 516 the resubstitution is added to the list of the previously accepted resubstitutions. The process ends at block 518.

In the flow charts above, one or more of the methods are embodied in a computer readable storage medium containing computer readable code such that a series of steps are performed when the computer readable code is executed (by a processing unit) on a computing device. In some implementations, certain processes of the methods are combined, performed simultaneously or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic", or "system." Furthermore, the present invention may take the form of a computer program product on a computer-usable storage medium having computer-usable program code embodied in or on the medium.

As will be further appreciated, the processes in embodiments of the present invention may be implemented using any combination of software, firmware, microcode, or hardware.

As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may contain, store, communicate, propagate, or transport the program for use by or in connection with the execution system, apparatus, or device. The methods of the invention may be practiced by combining one or more machine-readable storage devices containing the code according to the described embodiment(s) with appropriate processing hardware to execute the code contained therein. An apparatus for practicing the invention could be one or more processing devices and storage systems containing or having network access (via servers) to program(s) coded in accordance with the invention. In general, the term computer, computer system, or data processing system can be broadly defined to encompass any device having a processor (or processing unit) which executes instructions/code from a memory medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for reducing the size of a logic network design on a data processing system, prior to verification of the logic network design, utilizing a resubstitution the method comprising:
   the data processing system receiving a logic network having a plurality of registers;
   associating the logic network with one or more invariants, wherein the invariants provide information about one or more reachable states of the logic network design;
   dynamically selecting, from among the plurality of registers, a relevant register of a Boolean function basis set;
   determining if one or more resubstitutions of the selected relevant register exist, wherein the resubstitutions are Boolean function resubstitutions and are compatible resubstitutions that express the selected relevant register as at least one pre-existing register of fixed initial state;
   in response to determining the existence of one or more resubstitutions, refining the one or more resubstitutions utilizing the one or more invariants;
   re-expressing the selected relevant register using the one or more resubstitutions; and
   the data processing system generating a reduced size logic network design utilizing the one or more resubstitutions.

2. The method of claim 1, further comprising:
   receiving the one or more invariants wherein the one or more invariants are local properties of the logic network design, wherein the local properties comprise one or more of:
      a signal is constant in all reachable states;
      two signals are equivalent in all reachable states;
      a set of four signals have a fixed logical relationship in all reachable states; and
      a Boolean implication exists between two signals in all reachable states;
   assigning one or more invariants to one or more Boolean functions; and
   enabling one or more resubstitutions to be detected when a Boolean Satisfiability (SAT) formulation contains the one or more invariants.

3. The method of claim 2, further comprising:
   receiving one or more of a satisfiable and unsatisfiable result from a Boolean SAT solver, wherein when a satisfiable result is received and the resubstitution does not exist, assigning one or more additional signals to the Boolean function basis set, wherein assigning one or more additional signals to the Boolean function basis set increases a probability that the resubstitution is detected in one or more subsequent cycles.

4. The method of claim 1, further comprising:
   determining one or more solutions that are consistent with the invariants, wherein the one or more solutions satisfy each of the one or more invariants;
   wherein the generated reduced size logic network design is generated from the one or more solutions.

5. The method of claim 1, further comprising:
   in response to the re-expressing, eliminating the relevant register.

6. A computer system for reducing the size of a logic network design, prior to verification of the logic network design, utilizing a resubstitution, said computer system comprising:
   a processor component; and
   a utility executing on the processor component and which comprises code that causes the computer system to:
      receive a logic network having one or more registers;
      associating the logic network with one or more invariants, wherein the invariants provide information about one or more reachable states of the logic network design;
      dynamically select a relevant register of a Boolean function basis set;
      determine if one or more resubstitutions of the selected relevant register exist, wherein the resubstitutions are Boolean function resubstitutions and are compatible resubstitutions that express the selected relevant register as one or more pre-existing registers of fixed initial state;

in response determining the existence of one or more resubstitutions, refine the one or more resubstitutions utilizing the one or more invariants;

re-express the relevant register using the one or more resubstitutions; and generate a reduced size logic network design utilizing the one or more resubstitutions.

7. The computer system of claim 6, said code further comprising code that enables the computer system to:

receive the one or more invariants wherein the one or more invariants are local properties of the logic network design, wherein the local properties comprise one or more of:

a signal is constant in all reachable states;

two signals are equivalent in all reachable states;

a set of four signals have a fixed logical relationship in all reachable states; and a Boolean implication exists between two signals in all reachable states;

assign one or more invariants to one or more Boolean functions; and enable one or more resubstitutions to be detected when a Boolean Satisfiability (SAT) formulation contains the one or more invariants.

8. The computer system of claim 6, said code further comprising code that enables the computer system to:

determine one or more solutions that are consistent with the invariants, wherein the one or more solutions satisfy each of the one or more invariants;

wherein the generated reduced size logic network design is generated from the one or more solutions.

9. The computer system of claim 6, said code further comprising code that enables the computer system to:

in response to the re-expressing, eliminate the relevant register.

10. The computer system of claim 6, said code further comprising code that enables the computer system to:

receive one or more of a satisfiable and unsatisfiable result from a Boolean SAT solver, wherein when a satisfiable result is received and the resubstitution does not exist, assigning one or more additional signals to the Boolean function basis set, wherein assigning one or more additional signals to the Boolean function basis set increases a probability that the resubstitution is detected in one or more subsequent cycles.

11. A computer program product in a tangible computer-readable storage device for reducing the size of a logic network design, prior to verification of the logic network design, utilizing a resubstitution, wherein the resubstitution is a Boolean function resubstitution, said computer program product comprising:

the tangible computer-readable storage device; and program code on the tangible computer-readable storage device that when executed by a computer device provides the functions of:

the computer device receiving a logic network having one or more registers;

associating the logic network with one or more invariants, wherein the invariants provides information about one or more reachable states of the logic network design;

dynamically selecting a relevant register of a Boolean function basis set;

determining if one or more resubstitutions of the selected relevant register exist, wherein the resubstitutions are Boolean function resubstitutions and are compatible resubstitutions that express the selected relevant register as one or more pre-existing registers of fixed initial state;

in response determining the existence of one or more resubstitutions, refining the one or more resubstitutions utilizing the one or more invariants;

expressing the relevant register using the one or more resubstitutions; and generating a reduced size logic network design utilizing the one or more resubstitutions.

12. The computer program product of claim 11, the program code further comprising program code for:

receiving the one or more invariants wherein the one or more invariants are local properties of the logic network design, wherein the local properties comprise one or more of:

a signal is constant in all reachable states;

two signals are equivalent in all reachable states;

a set of four signals have a fixed logical relationship in all reachable states; and a Boolean implication exists between two signals in all reachable states;

assigning one or more invariants to one or more Boolean functions; and enabling one or more resubstitutions to be detected when a Boolean Satisfiability (SAT) formulation contains the one or more invariants.

13. The computer program product of claim 11, the program code further comprising program code for:

determining one or more solutions that are consistent with the invariants, wherein the one or more solutions satisfy each of the one or more invariants;

wherein the generated reduced size logic network design is generated from the one or more solutions.

14. The computer program product of claim 11, the program code further comprising program code for:

in response to the re-expressing, eliminating the relevant register.

15. The computer program product of claim 11, the program code further comprising program code for:

receiving one or more of a satisfiable and unsatisfiable result from a Boolean SAT solver, wherein when a satisfiable result is received and the resubstitution does not exist, assigning one or more additional signals to the Boolean function basis set, wherein assigning one or more additional signals to the Boolean function basis set increases a probability that the resubstitution is detected in one or more subsequent cycles.

* * * * *